United States Patent [19]

McClelland et al.

[11] Patent Number: 5,300,959
[45] Date of Patent: Apr. 5, 1994

[54] EFFICIENT CONDUCTOR ROUTING FOR INKJET PRINTHEAD

[75] Inventors: Paul H. McClelland, Monmouth; Kenneth E. Trueba; Neal W. Meyer, both of Corvallis, all of Oreg.

[73] Assignee: Hewlett-Packard Company, Palo Alto, Calif.

[21] Appl. No.: 862,667

[22] Filed: Apr. 2, 1992

[51] Int. Cl.$^5$ .................................................. G01D 15/18
[52] U.S. Cl. .................................. 346/140 R; 156/645; 346/1.1
[58] Field of Search ........................... 345/140 R, 1.1; 156/633, 645; 204/11; 29/891.1

[56] References Cited

U.S. PATENT DOCUMENTS

| | | | |
|---|---|---|---|
| 4,312,009 | 1/1982 | Lange et al. | 346/140 R |
| 4,450,455 | 5/1984 | Sugitani et al. | 346/140 R |
| 4,490,728 | 12/1984 | Vaught et al. | 346/1.1 |
| 4,500,326 | 10/1985 | Allen et al. | 346/140 R |
| 4,500,895 | 2/1985 | Buck et al. | 346/140 R |
| 4,502,060 | 2/1985 | Rankin et al. | 346/140 |
| 4,558,333 | 12/1985 | Sugitani et al. | 346/140 R |
| 4,568,953 | 2/1986 | Aoki et al. | 346/140 |
| 4,580,149 | 4/1986 | Domoto et al. | 346/140 |
| 4,587,534 | 5/1986 | Saito et al. | 346/140 R |
| 4,611,219 | 9/1986 | Sugitani et al. | 346/140 R |
| 4,683,481 | 7/1987 | Johnson | 346/140 R |
| 4,695,854 | 9/1987 | Cruz-Uribe | 346/140 |
| 4,712,172 | 12/1987 | Kiyohara et al. | 346/1.1 |
| 4,734,717 | 3/1988 | Rayfield | 346/140 |
| 4,746,935 | 5/1988 | Allen | 346/140 |
| 4,773,971 | 9/1988 | Lam et al. | 204/11 |
| 4,780,177 | 10/1988 | Wojnarowski et al. | 156/643 |
| 4,791,440 | 11/1988 | Eldridge et al. | 346/140 R |
| 4,801,955 | 1/1989 | Miura et al. | 346/140 R |
| 4,829,319 | 5/1989 | Chan et al. | 346/1.1 |
| 4,842,677 | 6/1989 | Wojnarowski et al. | 156/643 |
| 4,847,630 | 7/1989 | Bhaskar et al. | 346/1.1 |
| 4,878,992 | 11/1989 | Campanelli | 156/633 |
| 4,890,126 | 12/1989 | Hotomi | 346/140 R |
| 4,914,562 | 4/1990 | Abe et al. | 346/140 R |
| 4,915,981 | 4/1990 | Traskos et al. | 427/53.1 |
| 4,926,197 | 5/1990 | Childers et al. | 346/140 R |
| 4,942,408 | 7/1990 | Braun | 346/140 |
| 5,057,853 | 10/1991 | Fisher | 346/140 R |
| 5,059,989 | 10/1991 | Eldridge et al. | 346/140 R |
| 5,189,437 | 2/1993 | Michaels et al. | 346/1.1 |

FOREIGN PATENT DOCUMENTS

| | | | |
|---|---|---|---|
| 0309146A2 | 3/1989 | European Pat. Off. | 346/140 PD |
| 0367541A2 | 5/1990 | European Pat. Off. | |
| 62-170350 | 7/1987 | Japan | B41J 3/04 |

OTHER PUBLICATIONS

Gary L. Seiwell et al., "The ThinkJet Orifice Plate: A Part With Many Functions," May 1985, Hewlett Packard Journal, pp. 33-37.

J. I. Crowley et al., "Nozzles for Ink Jet Printers," IBM Technical Disclosure Bulletin, vol. 25, No. 8, Jan. 1983.

J. T. C. Yeh, "Laser Ablation of Polymers," J. Vac. Sci. Tech. May/Jun. 1986, pp. 653-658.

Thomas A. Znotins et al., "Excimer Lasers: An Emerging Technology in Materials Processing," Laser Focus Electro Optics, May 1987, pp. 54-70.

V. Srinivasan, et al., "Excimer Laser Etching of Polymers," Department of Chemical Engineering, Clarkson University, Potsdam, New York, received Dec. 30, 1985; accepted for publication, Feb. 19, 1986.

(List continued on next page.)

Primary Examiner—A. T. Grimley
Assistant Examiner—Thu Dang

[57] ABSTRACT

A novel, nozzle member for an inkjet print cartridge and method of forming the nozzle member are disclosed. In this method, the nozzles or orifices are formed in a flexible polymer tape by Excimer laser ablation. In one embodiment, a substrate containing heating elements is mounted on the back of the nozzle member. Conductors for providing electrical signals to the substrate are located inside the flexible polymer tape and end at a via overlying an associated electrode on the substrate. The via electrically connects the conductors to the associated electrode.

20 Claims, 6 Drawing Sheets

OTHER PUBLICATIONS

W. Childers, et al., "An Ink Jet Print Head Having Two Cured Photoimaged Barrier Layers," Copending Appln. Ser. No. 07/679,378 filed Apr. 2, 1991, 29 pp.

R. Srinivasan et al., "Self-Developing Photoetching of Poly(ethyleneterephthalate) Films by Far-Ultraviolet Excimer Laser Radiation," IBM Thomas J. Watson Research Center, Yorktown Heights, New York; received May 10, 1982; accepted for publication Jul. 2, 1982.

R. Srinivasan, "Kinetics of the Ablative Photodecompositon of Organic Polymers in the Far Ultraviolet," IBM Thomas J. Watson Research Center, Yorktown Heights, New York; received Mar. 21, 1983; accepted for publication Jun. 24, 1983.

Neilsen, Niels J., "History of Thinkjet Printhead Development," Hewlett–Packard Journal, May 1985, pp. 4–7.

EFFICIENT CONDUCTOR ROUTING FOR INKJET PRINTHEAD

CROSS REFERENCE TO RELATED APPLICATIONS

This application relates to the subject matter disclosed in the following United States patent and co-pending U.S. applications:

U.S. Pat. No. 4,926,197 to Childers, entitled "Plastic Substrate for Thermal Ink Jet Printer;"

U.S. application Ser. No. 07/864,889 filed herewith, entitled "Laser Ablated Nozzle Member For Inkjet Printhead;"

U.S. application Ser. No. 07/862,669 filed herewith, entitled "Nozzle Member Including Ink Flow Channels;"

U.S. application Ser. No. 07/864,822 filed herewith, entitled "Improved Inkjet Printhead;"

U.S. application Ser. No. 07/862,086 filed herewith, entitled "Improved Ink Delivery System for an Inkjet Printhead;"

U.S. application Ser. No. 07/864,930 filed herewith, entitled "Structure and Method for Aligning a Substrate With Respect to Orifices in an Inkjet Printhead;"

U.S. application Ser. No. 07/864,896 filed herewith, entitled "Adhesive Seal for an Inkjet Printhead;"

U.S. application Ser. No. 07/862,668 filed herewith, entitled "Integrated Nozzle Member and TAB Circuit for Inkjet Printhead;"

U.S. application Ser. No. 07/864,890 filed herewith, entitled "Wide Inkjet Printhead."

The above patent and copending applications are signed to the present assignee and are incorporated herein by reference.

FIELD OF THE INVENTION

The present invention generally relates to inkjet printers and, more particularly, to nozzle or orifice members and other components for the print cartridges used in inkjet printers.

BACKGROUND OF THE INVENTION

Thermal inkjet print cartridges operate by rapidly heating a small volume of ink, causing the ink to vaporize and be ejected through an orifice to strike a recording medium, such as a sheet of paper. When a number of orifices are arranged in a pattern, the properly sequenced ejection of ink from each orifice causes characters or other images to be printed upon the paper as the printhead is moved relative to the paper. The paper is typically shifted each time the printhead has moved across the paper. The thermal inkjet printer is fast and quiet, as only the ink strikes the paper. These printers produce high quality printing and can be made both compact and portable.

In one design, the printhead includes: 1) an ink reservoir and ink channels to supply the ink to the point of vaporization proximate to an orifice; 2) a nozzle member in which the individual orifices are formed in the required pattern; and 3) a series of thin film heaters, one below each orifice, formed on a substrate which forms one wall of the ink channels. Each heater includes a thin film resistor and appropriate current leads. To print a single dot of ink, an electrical current from an external power supply is passed through a selected heater. The heater is ohmically heated, in turn superheating a thin layer of the adjacent ink, resulting in explosive vaporization and, consequently, causing a droplet of ink to be ejected through an associated orifice onto the paper.

One prior print cartridge is disclosed in U.S. Pat. No. 4,500,895 to Buck et al., entitled "Disposable Inkjet Head," issued Feb. 19, 1985 and assigned to the present assignee.

In these printers, print quality depends upon the physical characteristics of the orifices in a printhead incorporated on a print cartridge. For example, the geometry of the orifices in a printhead affects the size, trajectory, and speed of ink drop ejection. In addition, the geometry of the orifices in a printhead can affect the flow of ink supplied to vaporization chambers and, in some instances, can affect the manner in which ink is ejected from adjacent orifices. Nozzle members for inkjet printheads often are formed of nickel and are fabricated by lithographic electroforming processes. One example of a suitable lithographic electroforming process is described in U.S. Pat. No. 4,773,971, entitled "Thin Film Mandrel" and issued to Lam et al. on Sep. 27, 1988. In such processes, the orifices in an nozzle member are formed by overplating nickel around dielectric discs.

Such electroforming processes for forming nozzle members for inkjet printheads have several shortcomings. One shortcoming is that the processes require delicate balancing of parameters such as stress and plating thicknesses, disc diameters, and overplating ratios. Another shortcoming is that such electroforming processes inherently limit design choices for nozzle shapes and sizes.

When using electroformed nozzle members and other components in printheads for inkjet printers, corrosion by the ink can be a problem. Generally speaking, corrosion resistance of such nozzle members depends upon two parameters: inkjet chemistry and the formation of a hydrated oxide layer on the electroplated nickel surface of an nozzle member. Without a hydrated oxide layer, nickel may corrode in the presence of inks, particularly water-based inks such as are commonly used in inkjet printers. Although corrosion of nozzle members can be minimized by coating the plates with gold, such plating is costly.

Yet another shortcoming of electroformed nozzle members for inkjet printheads is that the completed printheads have a tendency to delaminate during use. Usually, delamination begins with the formation of small gaps between an nozzle member and its substrate, often caused by differences in thermal expansion coefficients of an nozzle member and its substrate. Delamination can be exacerbated by ink interaction with printhead materials. For instance, the materials in an inkjet printhead may swell after prolonged exposure to water-based inks, thereby changing the shape of the printhead internal structure.

Even partial delamination of an nozzle member can result in distorted printing. For example, partial delamination of an nozzle member usually causes decreased or highly irregular ink drop ejection velocities. Also, partial delamination can create accumulation sites for air bubbles that interfere with ink drop ejection.

Further, in prior art printheads for inkjet printers, it has been shown to be difficult to connect electrodes on the substrate which contains the thin film heaters to conductors on the printhead which are, in turn, connected to an external power supply for energizing the thin film heaters.

Thus, what is needed is a printhead having an improved nozzle member which does not suffer from the drawbacks of electroformed nozzle members and having an improved conductor configuration for connecting electrodes on the substrate to the conductors on the printhead for connection to an external power supply.

SUMMARY OF THE INVENTION

A novel, nozzle member for an inkjet print cartridge and method of forming the nozzle member are disclosed. In this method, the nozzles or orifices are formed in a flexible polymer tape by Excimer laser ablation. In one embodiment, a substrate containing heating elements is mounted on the back of the nozzle member. External conductors are located inside the flexible polymer tape and run between each of the nozzles. The conductors end at a via overlying an associated electrode on the substrate. The via electrically connects the conductors to the associated electrode.

In other aspects of the invention, vaporization chambers as well as ink channels, enabling ink to flow proximate to the orifices, are also formed by Excimer laser ablation.

The polymer material preferably is plastic such as teflon, polyamide, polymethylmethacrylate, polyethyleneterephthalate or mixtures and combinations thereof.

BRIEF DESCRIPTION OF THE DRAWINGS

The present invention can be further understood by reference to the following description and attached drawings which illustrate the preferred embodiments.

Other features and advantages will be apparent from the following detailed description of the preferred embodiments, taken in conjunction with the accompanying drawings, which illustrate, by way of example, the principles the invention.

DETAILED DESCRIPTION OF THE PREFERRED EMBODIMENTS

Figure 1:
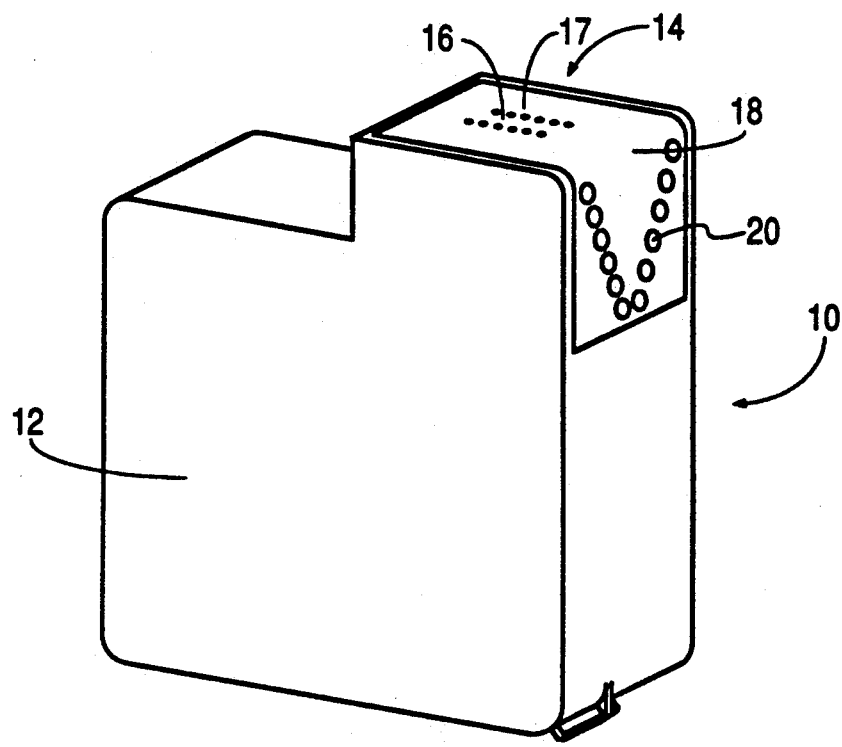
FIG. 1 is a perspective view of an inkjet print cartridge according to the present invention.

Referring to FIG. 1, reference numeral 10 generally indicates an inkjet print cartridge according to one embodiment of the present invention. The inkjet print cartridge 10 includes an ink reservoir 12 and a printhead 14. The printhead 14 has a nozzle member 16 having two parallel columns of holes or orifices 17 formed in a flexible polymer tape 18 by laser ablation. The tape 18 may be purchased commercially as Kapton TM, Upilex TM, or their equivalent, available from 3M Corporation.

Figure 2:
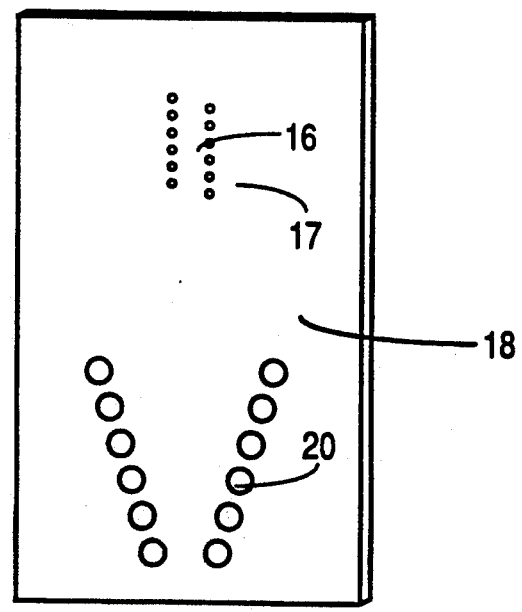
FIG. 2 is a perspective view of the front surface of the nozzle member and electrical contact points on the printhead shown in FIG. 1.

FIG. 2 shows a front surface, in perspective, of the nozzle member 16 of FIG. 1 removed from the print cartridge 10. Behind the nozzle member 16 is a silicon substrate containing a plurality of individually energizable thin film resistors. Each resistor is associated with a single orifice 17 in the nozzle member 16 and acts as an ohmic heater when selectively energized by a pulse applied to one of the associated contact pads 20. The contact pads 20 connect to conductive traces formed internal to the tape 18, as will be described in detail later.

Figure 3:
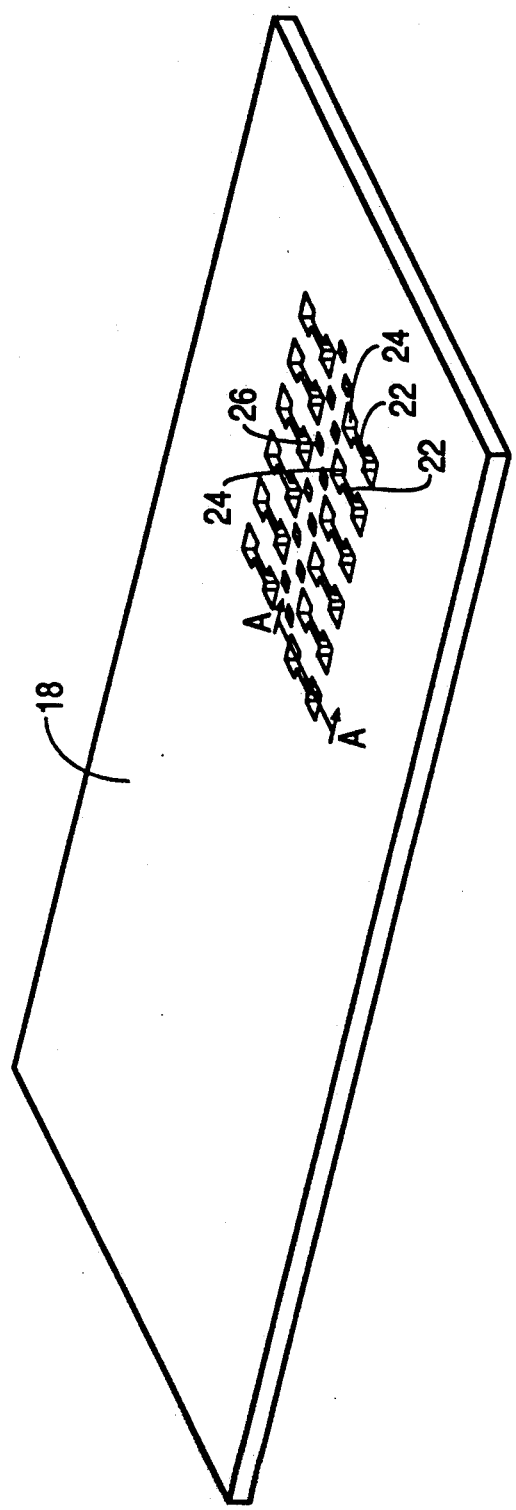
FIG. 3 is a perspective view of the back of the tape of FIG. 2, revealing vaporization chambers, ink channels, and conductive vias for connection to electrodes on a silicon die which is to be mounted on the top surface of the tape of FIG. 3.

FIG. 3 is a perspective view of the back of the tape 18 of FIG. 2 prior to a silicon die being mounted thereon. Shown in FIG. 3 are ink channels 22, which are in fluid communication with an ink supply, wherein ink is fed around the edges of the silicon die to the ink channels 22 after the silicon die is mounted on the surface of the tape of FIG. 3. Each ink channel 22 is also in fluid communication with an associated vaporization chamber 24. When the silicon die is mounted to the tape 18 in FIG. 3, each of the heating elements on the silicon die aligns with an associated vaporization chamber 24 and, when the associated heating element is energized, the ink within the vaporization chamber 24 is vaporized and expelled as a droplet of ink through an associated orifice approximately centrally formed through vaporization chamber 24.

Figure 4:
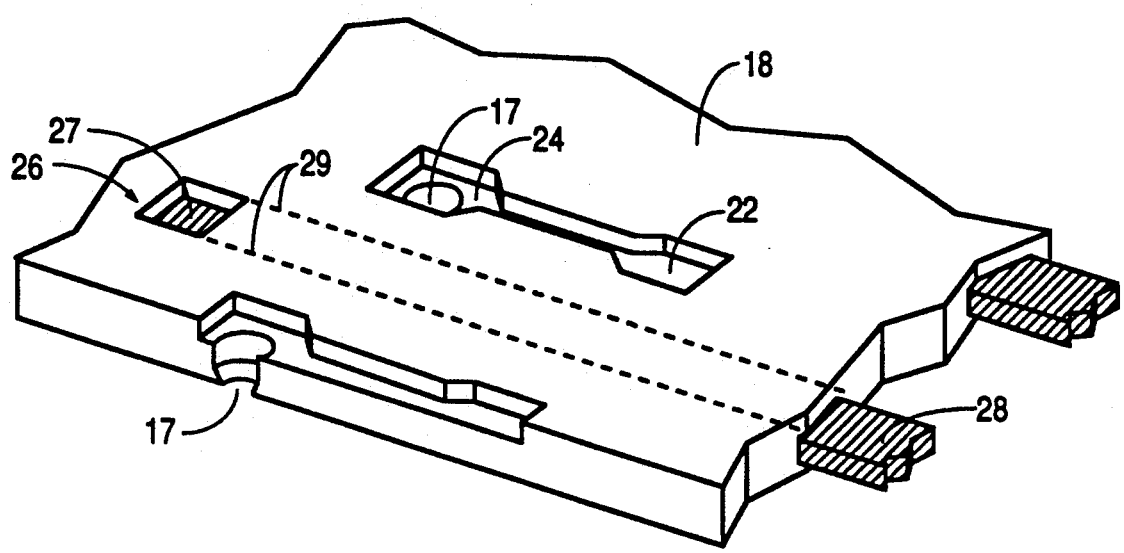
FIG. 4 is an enlarged perspective view, in cross-section and partially cut away, of the vaporization chambers, ink channels, and conductive vias shown in FIG. 3, taken along the line A—A in FIG. 3.

Also shown in FIG. 3 are openings 26 which expose conductive traces running internal to the tape 18. The internal conductors may be formed in a variety of ways, including forming conductive traces on the back of a nozzle member and then encapsulating the conductive traces using a lamination process. The traces may be formed using a conventional photolithographic process. The trace portions revealed through the openings 26 connect to the contact pads 20 shown on the front surface of the tape 18 in FIG. 2. The exposed traces through openings 26 are connected to electrodes on the silicon die when the silicon die is mounted on the surface of the tape 18 of FIG. 3. The openings 26 may be formed by laser ablation.

shown in FIG. 4 is an enlarged view of a portion of the surface of the tape 18 of FIG. 3, taken along line A-A in FIG. 3, showing in more detail the vaporization chambers 24, ink channels 22, orifices 17, and a portion of a conductive trace 28 leading to the trace portions 27 exposed through the opening 26. The dashed lines 29 illustrate the trace 28 running inside the tape 18.

Figure 5:
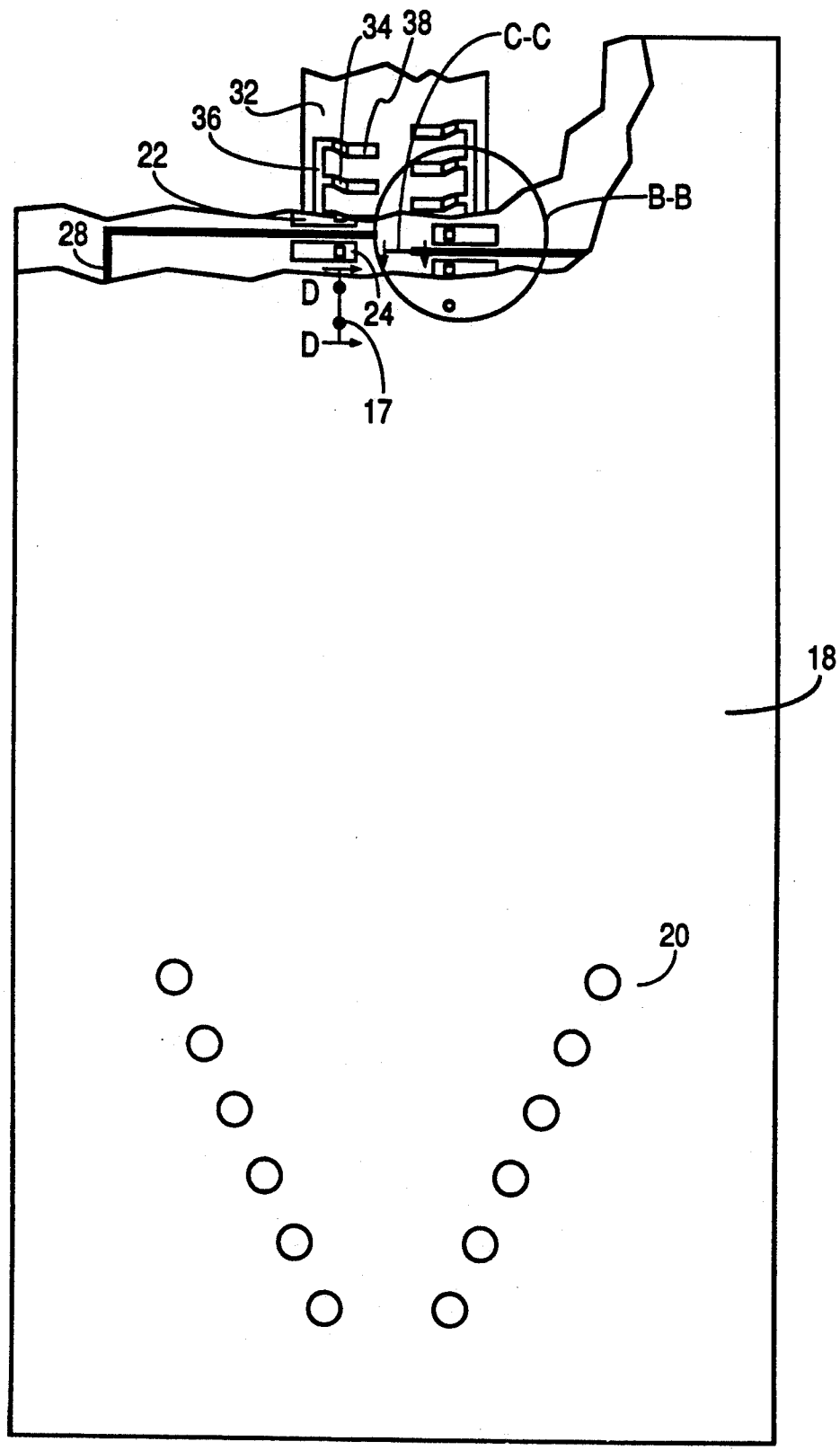
FIG. 5 is a view of the front of the nozzle member of FIG. 2, partially cut away, revealing the front surface of the nozzle member, a middle portion of the nozzle member, and a silicon die mounted on a back surface of the nozzle member.

FIG. 5 is a view of the front surface of the tape 18 of FIG. 2 cut away to reveal a middle portion of the tape 18 and the substrate 32 containing thin film resistors 34, which are energized by applying a voltage, such as ground potential, to a common electrode 36 and applying a pulse to any of the electrodes 38 to energize an associated resistor 34.

Overlying each of the resistors 34 is a vaporization chamber 24, shown in detail in FIG. 4, and an orifice 17, wherein energization of a resistor 34 causes ink in the vaporization chamber 24 to be expelled through the associated orifice 17. Ink is fed from the back of the silicon die 32 so as to enter the ink channels 22 from around the edges of the silicon die 32 so as to provide ink to the various vaporization chambers 24.

The conductive traces 28 are shown within the tape 18 running between each of the orifices 17 to overlie an associated thin film resistor electrode 38. The other ends of the conductive traces 28 are terminated by the contact pads 20.

Figure 6:
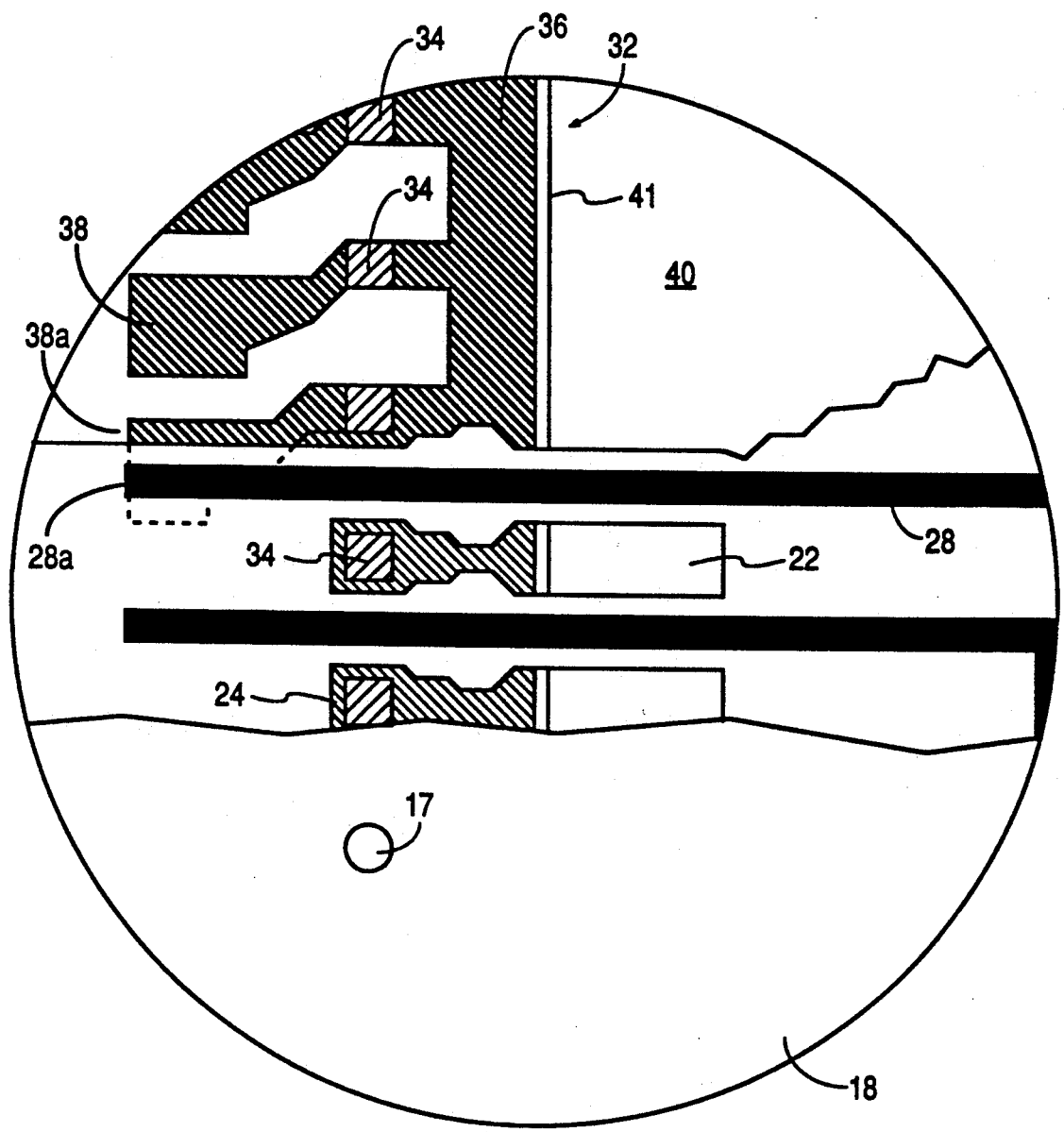
FIG. 6 is an enlarged view, partially cut away, of the circled portion B—B in FIG. 5.

FIG. 6 is an enlarged view of the tape 18 of FIG. 5 within the circle B—B of FIG. 5. Shown in detail in FIG. 6 are the common electrode 36, thin film resistors 34, electrodes 38 uniquely associated with each of the thin film resistors 34, ink channels 22, vaporization chambers 24, conductive traces 28, and orifice 17. Also shown is the ink feed source 40 which enables ink to flow around the edges 41 of the substrate 36 and to each of the ink channels 22.

In FIG. 6, the end portion of the conductor 28, shown as end portion 28a, is connected to an associated underlying electrode 38a by a via extending through the tape 18.

Figure 7:
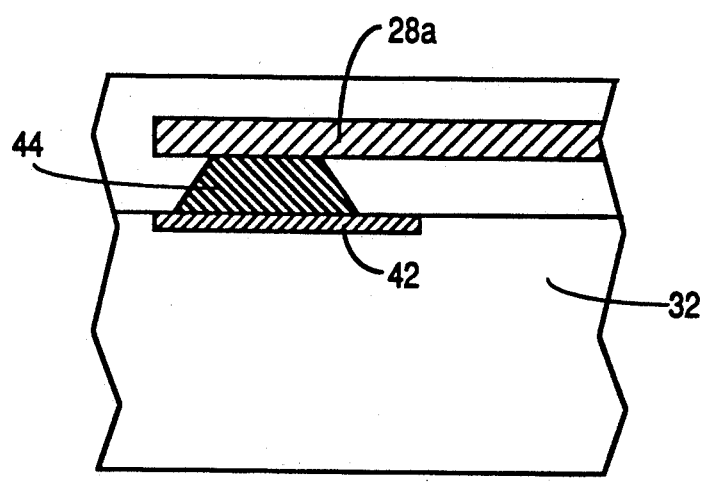
FIG. 7 is a cross-section taken along line C—C in FIG. 5 showing the connection of the conductors within the nozzle member to the electrodes on the silicon die.

FIG. 7 shows this connection made through the via, wherein the end of the conductor 28, shown as 28a, is connected to an electrode 42 on the silicon substrate 32 using a conductively filled polymer 44 (or any suitable material) to short the end 28a to the electrode 42 through the via. other bonding means, such as ultrasonic welding, may also be used with suitable conducting bumps, or reflow soldering may be used without bumps.

Figure 8:
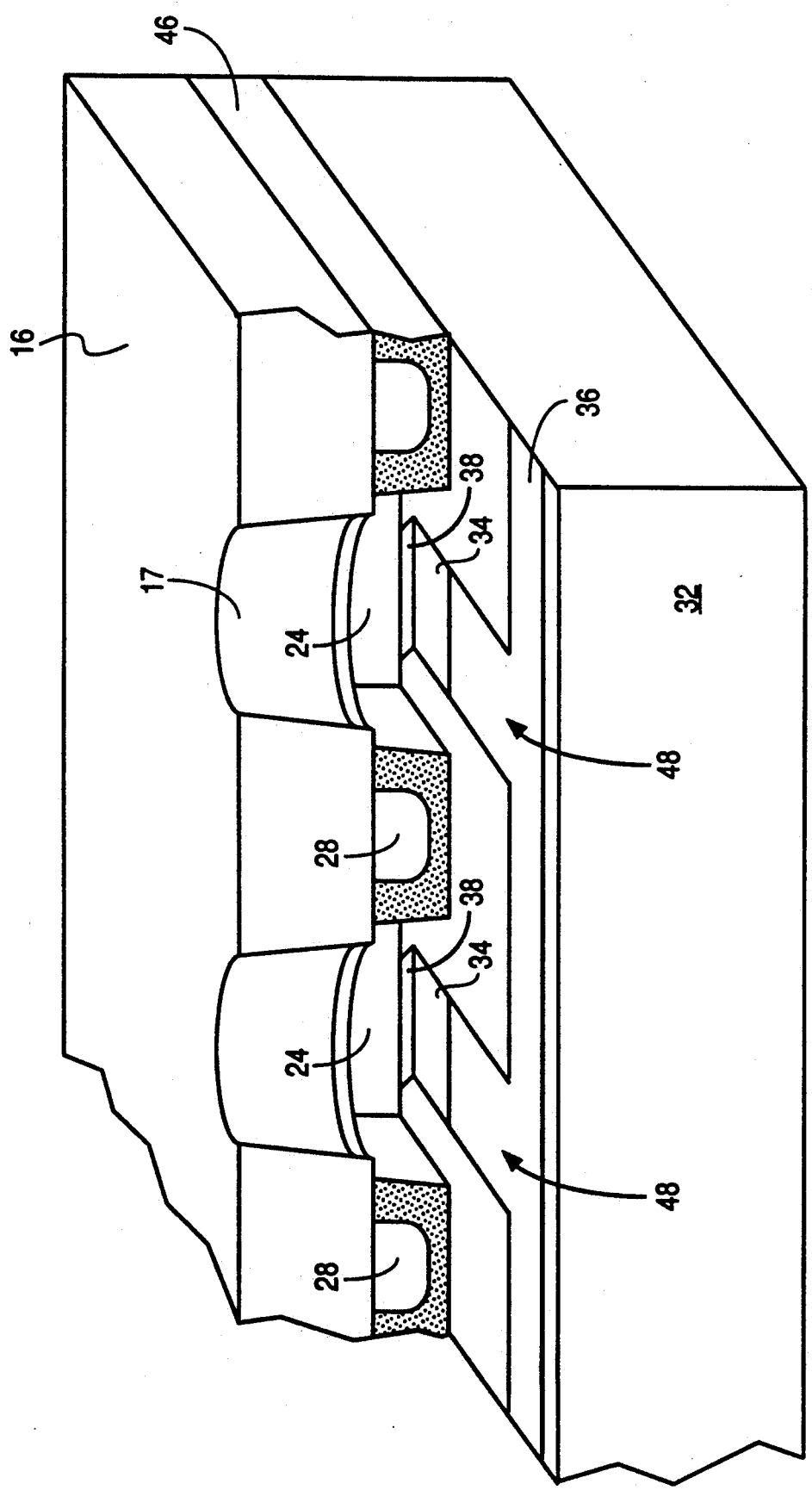
FIG. 8 is a perspective view of a cross-section, partially cut away, taken along line D—D in FIG. 5 illustrating the conductors formed therein running between the vaporization chambers.

FIG. 8 shows a cross-section of the tape 18, partially cut away, taken along the line D—D in FIG. 5, generally in line with a row of orifices 17 overlying each of the vaporization chambers 24 in FIG. 5. The numerals in FIG. 8 indicate the same elements as previously described.

FIG. 8 illustrates how the conductors 28 run between the vaporization chambers 24 and orifices 17. The conductors 28 may be formed on the bottom surface of the nozzle member 16 using a photolithographic process prior to the orifices 17 being formed. A liquid layer of, for example, phenolic butyryl modified epoxy may then be flowed over the conductors to encapsulate the conductors 28 in a flexible layer 46. Such a material may be obtained from Rogers Corporation in Chandler, Ariz. The resulting nozzle member 16 and laminated layer 46 are then laser ablated in a step-and-repeat process using an Excimer laser to form the orifices 17, vaporization chambers 24, and any other patterns. Such a laser ablation process is described in copending application Ser. No. 07/864,822, entitled "Improved Inkjet Printhead," assigned to the present assignees.

Also illustrated in FIG. 8 is the path 48 liquid ink takes from an ink source below the substrate 32 to enter the vaporization chambers 24.

As indicated in FIG. 8, the angled electrodes 38 leading from the thin film resistors 34 directly underlie an associated conductor 28 at a point obscured by the nozzle member 16 and layer 46. At the point where the conductor 28 and electrode 38 overlap, a via is formed as shown in FIG. 7 to connect the conductor 28 to the electrode 38.

The above-described concept of enclosing conductors in the nozzle member itself and connecting the conductors to electrodes on a substrate using a via may be applied to a variety of types of printhead structures. For example, instead of an edge ink-feed type printhead design, the concepts described herein can be applied to a center feed type printhead where ink is supplied to the orifices through a hole in the substrate. Further, the conductors do not have to run between the orifices to make contact with substrate electrodes, but may run in any pattern in order to overlie substrate electrodes so that an electrical connection may be made between the conductors and the electrodes with a suitable via. Further, the electrodes on the substrate do not have to connect to resistors on the substrate, but may connect to inputs of a demultiplexer or other decoder on the substrate which, in turn, provides the pulses to the resistors.

The foregoing has described the principles, preferred embodiments, and modes of operation of the present invention. However the invention should not be construed as being limited to the particular embodiments discussed. As an example, the above-described inventions can be used in conjunction with printers that are not of the thermal type, as well as printers that are of the thermal type, such as inkjet and thermal transfer printers. Thus, the above-described embodiments should be regarded as illustrative rather than restrictive, and it should be appreciated that variations may be made in those embodiments by workers skilled in the art without departing from the scope of the present invention as it is defined by the following claims.

What is claimed is:

1. A printhead for an ink printer comprising:

a unitary piece of flexible tape having a nozzle section and a conductor section, said nozzle section having an array of ink orifices formed therein for ejection of ink droplets therefrom, said nozzle section having a top insulating surface for facing a recording medium for printing; and a plurality of ink ejection elements, formed on a substrate attached to a back surface of said nozzle section, each of said ink ejection elements being located proximate to an associated one of said orifices, said ink ejection elements being selectively energized by applying a signal to one or more electrodes on said substrate, said conductor section including a plurality of conductors affixed directly to said flexible tape, each of said conductors having a first end connected to an associated one of said electrodes on said substrate, said conductors having remote second ends for connection to power supply terminals of an ink printer, said conductors carrying electrical signals for selectively energizing said ink ejection elements.

2. The printhead of claim 1 wherein substantially each of said conductors is associated with a different one of said ink ejection elements, and each of said ink ejection elements is connected to one of said electrodes.

3. The printhead of claim 2 wherein said conductors run between substantially each of said ink orifices to contact an associated one of said electrodes.

4. The printhead of claim 1 wherein said ink orifices are formed in a polymer tape by laser ablation.

5. The printhead of claim 1 wherein said nozzle section also includes an ink ejection chamber associated with each of said orifices, wherein energization of an associated ink ejection element causes a portion of ink within said ink ejection chamber to be expelled from an associated orifice.

6. The printhead of claim 1 wherein ink is fed around an outer edge of said substrate to ink channels formed in said nozzle section so as to flow proximate to said orifices.

7. The printhead of claim 1 wherein said conductors are formed on a surface of said tape, and an insulating layer is formed on said surface of said tape to encapsulate said conductors.

8. The printhead of claim 7 wherein said tape is a polymer tape, said conductors are formed on a surface of said polymer tape, and said orifices are formed in said polymer tape by laser ablation.

9. The printhead of claim 8 wherein said insulating layer is laminated onto said surface of said tape to encapsulate said conductors, and ink ejection chambers are formed in said insulating layer.

10. The printhead of claim 9 wherein said ink ejection chambers and said orifices are formed by laser ablation.

11. A method for forming a printhead for an ink printer comprising the steps of:
    forming conductors directly on a surface of a strip of insulating tape, said conductors having first ends, said conductors having remote second ends for connection to an ink printer, said conductors for carrying electrical signals for energizing ink ejection elements in a printhead;
    forming an array of ink orifices in a nozzle section portion of said strip of insulating tape remote from said second ends of said conductors, said orifices for ejecting ink droplets onto a recording medium when said recording medium faces a top surface of said nozzle section;
    attaching a substrate to a bottom surface of said nozzle section, said substrate including a plurality of said ink ejection elements, each of said ink ejection elements being located proximate to an associated one of said orifices, said ink ejection elements being selectively energized by applying a signal to one or more electrodes on said substrate; and
    connecting said first ends of said conductors to associated ones of said electrodes on said substrate.

12. The method of claim 11 wherein substantially each of said conductors is associated with a single ink ejection element, and each ink ejection element is connected to one of said electrodes.

13. The method of claim 12 wherein said conductors run between substantially each of said ink orifices to contact an associated one of said electrodes.

14. The method of claim 11 wherein said ink orifices are formed in a polymer tape by laser ablation.

15. The method of claim 11 further comprising the step of encapsulating said conductors in an insulating layer laminated onto said surface of said tape.

16. The method of claim 15 wherein said insulating layer also includes an ink ejection chamber associated with each of said orifices, wherein energization of an associated ink ejection element causes a portion of ink within said ink ejection chamber to be expelled from an associated orifice.

17. The method of claim 16 wherein said ink ejection chamber and said orifices are formed by laser ablation.

18. The method of claim 16 wherein said tape is a polymer tape, and said orifices are formed in said polymer tape by laser ablation.

19. A nozzle member mounted to a substrate in a printhead, said nozzle member comprising:
    a polymer tape having a plurality of ink orifices for directing trajectories of ejected ink, said polymer tape having a top surface for facing a recording medium for printing;
    a plurality of conductors formed on said polymer tape for supplying electrical signals to energize ink ejection elements formed on a substrate mounted to said nozzle member, said conductors having first ends for electrical connection to electrodes on said substrate and remote second ends for connection to power supply terminals in an ink printer; and
    an insulating layer laminated to a bottom surface of said polymer tape to enclose and insulate said conductors, said insulating layer having vias formed therethrough for providing electrical connection to said conductors formed on said polymer tape, said vias being positioned to contact electrodes on said substrate for selectively energizing said ink ejection elements.

20. The nozzle member of claim 19, wherein said insulating layer is made from a polymer material.

* * * * *